United States Patent
Ahn et al.

(10) Patent No.: US 6,740,977 B2
(45) Date of Patent: May 25, 2004

(54) INSULATING LAYERS IN SEMICONDUCTOR DEVICES HAVING A MULTI-LAYER NANOLAMINATE STRUCTURE OF SINX THIN FILM AND BN THIN FILM AND METHODS FOR FORMING THE SAME

(75) Inventors: Jae-Young Ahn, Sungnam (KR); Yong-Woo Hyung, Yungin (KR); Young-Seok Kim, Suwon (KR); Man-Sug Kang, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/422,283

(22) Filed: Apr. 24, 2003

(65) Prior Publication Data

US 2003/0201540 A1 Oct. 30, 2003

(30) Foreign Application Priority Data

Apr. 24, 2002 (KR) .................. 10-2002-0022516

(51) Int. Cl.[7] .................. H01L 23/48; H01L 23/52; H01L 29/40
(52) U.S. Cl. .................. 257/760; 438/624; 438/643; 438/778
(58) Field of Search .................. 257/760; 438/624, 438/643, 778

(56) References Cited

U.S. PATENT DOCUMENTS

| | | | | |
|---|---|---|---|---|
| 4,699,861 A | * | 10/1987 | Mizukami | 430/64 |
| 4,844,719 A | * | 7/1989 | Toyomoto et al. | 95/52 |
| 6,284,646 B1 | * | 9/2001 | Leem | 438/629 |
| 6,391,769 B1 | * | 5/2002 | Lee et al. | 438/643 |
| 6,466,403 B1 | * | 10/2002 | Sato et al. | 360/126 |
| 2003/0013320 A1 | * | 1/2003 | Kim et al. | 438/778 |

FOREIGN PATENT DOCUMENTS

| | | | | |
|---|---|---|---|---|
| JP | 63-187254 | * | 2/1988 | G03G/5/14 |
| JP | 06-213690 | * | 5/1994 | G01D/21/00 |

* cited by examiner

Primary Examiner—George Fourson
Assistant Examiner—Fernando L. Toledo
(74) Attorney, Agent, or Firm—Mills & Onello, LLP

(57) ABSTRACT

The present invention discloses a novel insulating layer for use in semiconductor devices, the insulating layer having a multi-layer nanolaminate structure consisting of alternating boron nitride thin films and silicon nitride thin films, each of a controlled, desired thickness, together with methods for forming the same.

The insulating layer of the present invention has a multi-layer nanolaminate structure consisting of alternating boron nitride thin films and silicon nitride thin filmsformed by the steps of: (a) depositing a silicon nitride thin film on a wafer, (b) depositing a boron nitride thin film on the silicon nitride thin film, and (c) forming the multi-layer nanolaminate thin film by alternately repeating steps (a) and (b).

34 Claims, 5 Drawing Sheets

INSULATING LAYERS IN SEMICONDUCTOR DEVICES HAVING A MULTI-LAYER NANOLAMINATE STRUCTURE OF SINX THIN FILM AND BN THIN FILM AND METHODS FOR FORMING THE SAME

FIELD OF THE INVENTION

The present invention relates generally to an insulating layer film formed on a substrate of a semiconductor device, and particularly to a dielectric film with a multilayer nanolaminate structure consisting of a boron nitride thin film and a silicon nitride thin film capable of improving the properties of a wet etching and lowering a dielectric constant. More particularly, the present invention relates to a method for depositing the multi-layer nanolaminate thin film using an atomic layer deposition (ALD) process.

BACKGROUND OF THE INVENTION

A boron nitride (BN) thin film has a low dielectric constant in a range of from about 2.2 to 5, according to the deposition conditions. The dielectric constant of a silicon nitride (SiNx) thin film, on the other hand, is about 7. Accordingly, when BN and SiNx thin films are used together, the capacitance of the BN thin film is decreased in comparison with that of the SiNx thin film causing a reduction in the propagation delay. At the same time, the properties of a BN thin film in dielectric film applications include an excellent mechanical resistance against chemical mechanical polishing (CMP) slurries and an excellent selective rate of a reactive ion etching (RIE) for a silicon dioxide layer ($SiO_2$) and a silicon nitride layer ($Si_3N_4$). Therefore, in semiconductor technology, there is increasing interest in the use of a BN thin film that is used as the low dielectric material and CMP-stop layer.

However, applications for the use of BN thin films is limited by such factors as an adhesive failure between the BN thin film and the corresponding underlying layer of the semiconductor and an out-diffusion of the boron from the BN thin film during the annealing step, because the BN thin film lacks chemical stability at elevated temperatures.

Also, most of the conventional BN thin films were deficient in the lack of step coverage properties when formed by plasma enhanced chemical vapor deposition (PECVD) processes.

Recently, atomic layer deposition (ALD) processes have been applied to the deposition of BN thin films to achieve excellent step coverage properties and uniformity, and to deposit a conformal stoichiometric boron nitride thin film at relatively low temperatures between about 200° C. and 250° C.

However, BN thin films deposited by ALD methods as described above still have performance problems, such as the fact that such films are apt to decompose by moisture in the atmosphere and are easily etched during high temperature wet chemical processing. Also, BN thin films deposited by ALD processes have typically demonstrated poor oxidation resistance.

SUMMARY OF THE INVENTION

To solve the problems as described above, a general object of the present invention is to provide insulating layers for semiconductor devices with a multi-layer nanolaminate structure consisting of SiNx/BN thin films, together with methods for forming such insulating layers so as to improve etching properties when using high temperature wet chemical processing and to lower the dielectric constant.

A further object of the invention is to provide insulating layers for semiconductor devices having a multi-layer nanolaminate structure consisting of alternating SiNx/BN thin films, and methods for forming such insulating layers which prevent or minimize out diffusion of boron from the BN thin film during processing.

In accordance with one aspect of this invention, the invention provides an insulating layer in a semiconductor device with a multi-layer nanolaminate structure wherein silicon nitride thin films and boron nitride thin films are alternately formed on a surface of a wafer.

A thickness of the silicon nitride thin films according to this invention is more than that of a monolayer of the silicon nitride thin film but also less than about 200 Å. A thickness of the boron nitride thin films according to this invention is more than that of a monolayer of the boron nitride thin film but also less than about 200 Å. In the multi-layer nanolaminate structures of this invention, the silicon nitride thin film preferably constitutes a bottom layer of the structure or both the top and bottom layers.

Furthermore, a preferred method for forming an insulating layer in a semiconductor device according to the present invention comprises the sequential steps of: forming a silicon nitride thin film on a wafer; forming a boron nitride thin film on the previously formed silicon nitride thin film; and then forming the remainder of a multi-layer nanolaminate thin film by alternately repeating the process for forming the silicon nitride thin film and the process for forming the boron nitride thin film until the desired number of alternating silicon nitride and boron nitride thin film layers has been deposited.

The processes of forming the silicon nitride thin film and the boron nitride thin film are repeated on the wafer in a desired number of depositing cycles in-situ, preferably between about 25–35 times and 35–45 times, respectively, using the ALD method. This thin film deposition process may be carried out at a wafer temperature of about 400° C. to 600° C. and at a deposition pressure of about 1 to 3 torr.

The depositing cycle or process for forming each silicon nitride thin film layer comprises the sequential steps of: introducing a first silicon nitride process gas containing Si to a chamber containing the wafer to be adsorbed on a surface of the wafer; introducing a second silicon nitride process gas to purge the chamber and to exhaust any of the first silicon nitride process gas that remains unadsorbed; introducing a third silicon nitride process gas containing a reactive nitrogen entity to the chamber to react with the portion of the first silicon nitride process gas that was adsorbed on the surface of the wafer, and, introducing a fourth silicon nitride process gas to purge the chamber and to exhaust any of the third silicon nitride process gas that remains unreacted along with any reaction by-products.

In a preferred embodiment, a member of the group consisting of $SiH_2Cl_2$, $SiCl_4$, $Si_2Cl_6$ and $SiH_4$ is used as the first silicon nitride process gas for the silicon nitride thin film deposition process. A substantially inert gas or $N_2$ gas is preferably used as the second silicon nitride process gas and the fourth silicon nitride process gas in this process. In a preferred embodiment, the third silicon nitride process gas used in this process is either $NH_3$ or $N_2H_4$ in the form of a gas or as a radical type, or, alternatively, a mixture of $N_2$ and $H_2$ as a mixture of a radical type.

The depositing cycle or process for forming each boron nitride thin film layer comprises the sequential steps of:

introducing a first boron nitride process gas containing B to a chamber containing the wafer to be adsorbed on a surface of a previously-formed silicon nitride thin film; introducing a second boron nitride process gas to purge the chamber and to exhaust any of the first boron nitride process gas that remains unadsorbed; introducing a third boron nitride process gas containing a reactive nitrogen entity to the chamber to react with the portion of the first boron nitride process gas that was adsorbed on the surface of the silicon nitride thin film; and, introducing a fourth boron nitride process gas to purge the chamber and to exhaust any of the third boron nitride process gas that remains unreacted along with any reaction by-products.

In a preferred embodiment, a member of the group consisting of $BCl_3$, $BBr_3$, $B_2H_6$ and $BF_3$ is used as the first boron nitride process gas for the boron nitride thin film deposition process. A substantially inert gas or $N_2$ gas is preferably used as the second boron nitride process gas and the fourth boron nitride process gas in this process. In a preferred embodiment, the third boron nitride process gas used in this process is either $NH_3$ or $N_2H_4$ in the form of a gas or as a radical type, or, alternatively, a mixture of $N_2$ and $H_2$ as a mixture of a radical type.

Other aspects, features and advantages of the present invention are disclosed in the detailed description that follows and by reference to the drawings.

BRIEF DESCRIPTION OF THE DRAWINGS

For a more complete understanding of the present invention and the advantages thereof, reference is now made to the following descriptions taken in conjunction with the accompanying drawings, in which like reference numerals designate like elements, and in which.

DETAILED DESCRIPTION OF PREFERRED EMBODIMENTS

Reference will now be made in detail to certain preferred embodiments of the present invention, as illustrated in the accompanying drawings.

Figure 1:
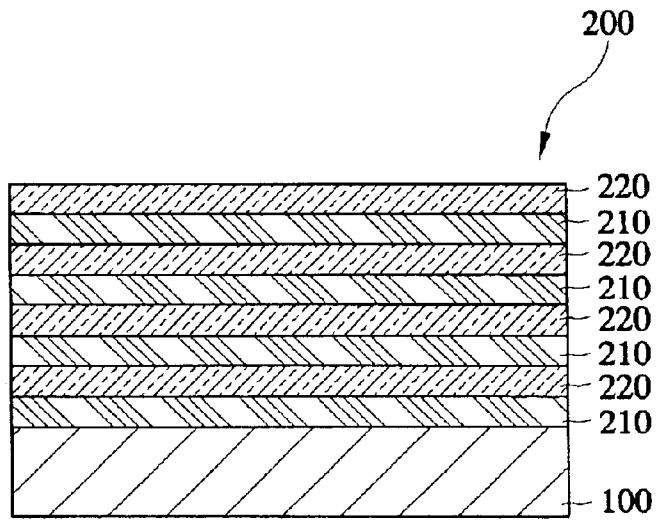
FIG. 1 schematically shows a cross-sectional view of an insulating layer having a multi-layer nanolaminate structure consisting of alternating SiNx/BN thin films according to an embodiment of the present invention.

FIG. 1 schematically shows a cross-sectional view of an insulating layer for a semiconductor device having a multi-layer nanolaminate structure consisting of alternating SiNx/BN thin films according to an embodiment of the present invention.

As shown in FIG. 1, the insulating layer used as a dielectric thin film in a semiconductor device according to the present invention alternately repeats a deposition of an amorphous SiNx thin film 210 and an amorphous BN thin film 220 on a surface of a wafer 100, thereby forming the muti-layer nanolaminate thin film structure denoted by reference numeral 200.

The muti-layer nanolaminate thin film 200 consisting of alternating SiNx/BN thin films of the invention is deposited by a remote plasma atomic layer deposition (RP-ALD) process in order as follows: proceeding with the predetermined number of cycles for depositing a first SiNx thin film 210 on wafer 100, proceeding with the predetermined number of cycles for depositing a first BN thin film 220, and thereafter alternately repeating the processes for depositing the SiNx thin film 210 and the BN thin film 220, thereby forming the multi-layer nanolaminate thin film 200 comprised of the alternating SiNx/BN thin films.

Figure 2A:
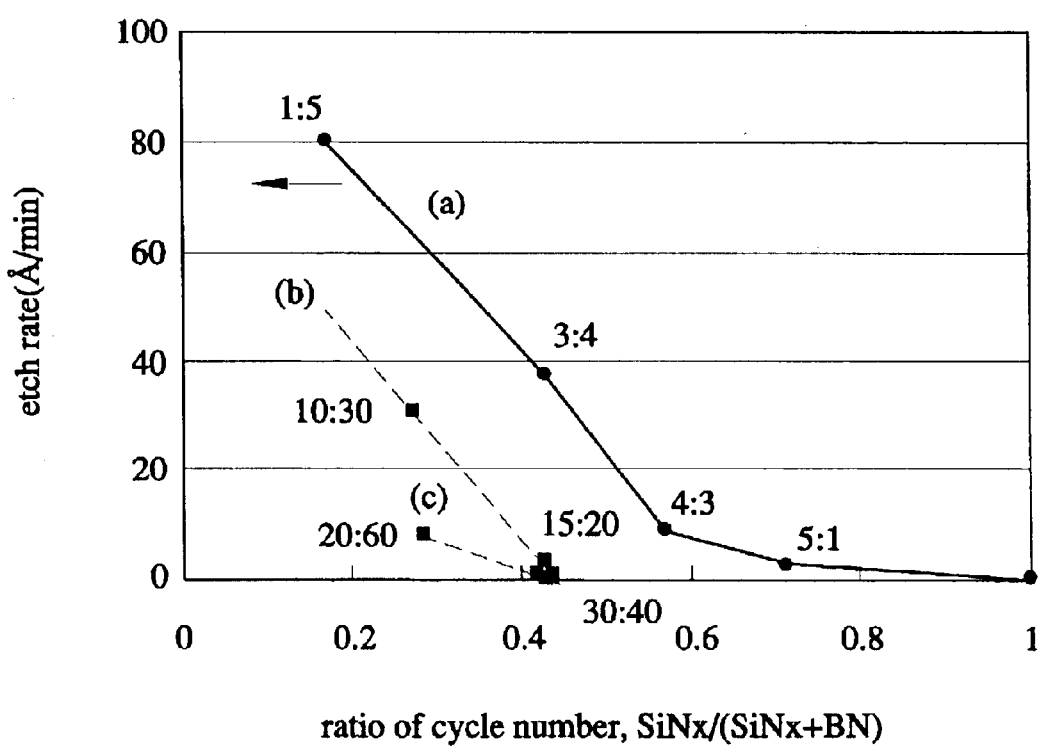
FIGS. 2A and 2B show graphs respectively representing changes in the etching rate for a semiconductor device using a high temperature wet chemical process and for the dielectric constant according to the number of depositing cycles of the SiNx thin film and BN thin film in a nanolaminate thin film consisting of alternating SiNx/BN thin films according to the present invention.
Figure 2B:
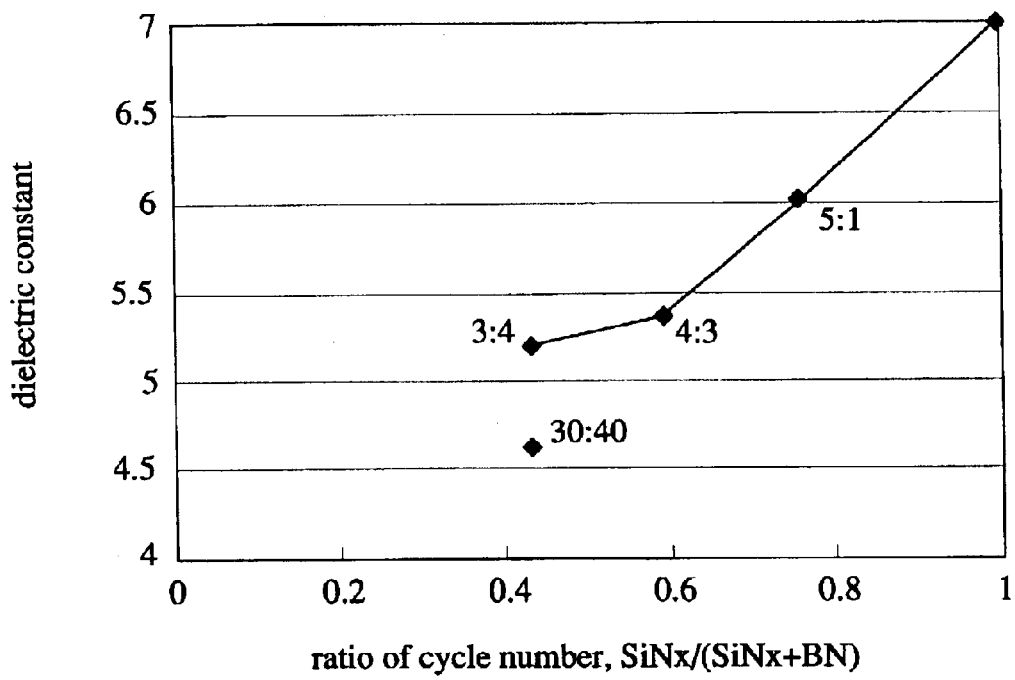

FIGS. 2A and 2B show graphs respectively representing changes in the etching rate for a semiconductor device using a high temperature wet chemical process and in the dielectric constant according to the number of depositing cycles of the SiNx thin film and the number of depositing cycles of the BN thin film in a nanolaminate thin film consisting of alternating SiNx/BN thin films according to the present invention.

FIG. 2A is a graph showing the etching rate of the nanolaminate thin film of SiNx/BN thin films for a high temperature wet chemical process, such as $H_2SO_4$ boiling, as a function of a ratio of cycle numbers (SiNx/SiNx+BN). In FIG. 2A: line "(a)" is a locus of points having the property that the quantity (m+n) (where m=the number of SiNx cycles and n=the number of BN cycles) is in the range of about 6 to 7; line "(b)" is a locus of points, wherein the quantity (m+n) is in the range of about 35 to 40; and line "(c)" is a locus of points, wherein the quantity (m+n) is in the range of about 70 to 80. Ratios on the lines (a), (b) and (c) indicate respectively the ratio of the cycle number "m" required to deposit each SiNx thin film to the cycle number "n" required to deposit each BN thin film, i.e. "m:n."

Referring to the FIG. 2A, it has been found in accordance with this invention that as the ratio (m/(m+n)) (plotted along the horizontal axis), i.e.,the cycle number m required to deposit the SiNx thin film in relation to the sum (m+n) of the cycle number m required to deposit the SiNx thin film and the cycle number n required to deposit the BN thin film, approaches approximately 1, the etching rate for a high temperature wet chemical process rapidly decreases. As a result, the etching rate decreases according to the increment of the depositing cycle of the SiNx thin film. It is believed that the explanation for this phenomenon is that SiNx thin film that is not etched by the $H_2SO_4$ boiling improves the stability of the BN thin film.

Furthermore, it is believed that under the same conditions of the ratio m/(m+n), the etching rate for the high temperature wet chemical process of the nanolaminate thin film consisting of alternating SiNx/BN thin films is decreased according to the increment of the sum (m+n) of the depositing cycle numbers of the SiNx thin film and the BN thin film.

FIG. 2B is a graph showing the dielectric constant of the nanolaminate thin film consisting of alternating SiNx/BN thin films as a function of the ratio of cycle numbers (SiNx/SiNx+BN) at different ratios (m/(m+n)) of the cycle number m of the SiNx thin film to the sum (m+n) of the cycle number m of the SiNx thin film and the cycle number n of the BN thin film. The ratios indicated on FIG. 2B designate a ratio of the cycle number required to deposit the SiNx thin film to the cycle number required to deposit the BN thin film, i.e. m:n.

Referring to the FIG. 2B, it has been found in accordance with this invention that the dielectric constant of the nanolaminate thin film consisting of alternating SiNx/BN thin films gradually decreases as the ratio ((m/(m+n))decreases; and, under the same condition of the ratio m/(m+n), the dielectric constant decreases as the sum (m+n) of the cycle number of the SiNx thin film and the cycle number of the BN thin film increases.

Therefore, as illustrated by FIG. 2A and FIG. 2B, the multi-layer nanolaminate thin film 200 comprised of alternating SiNx/BN thin films deposited in accordance with this invention, by suitably controlling the cycle number m of the SiNx thin film and the cycle number n of the BN thin film, can thereby be formed to obtain a desired low etching rate for high temperature wet chemical processing and a desired low dielectric constant. For example, at a ratio of m:n= 30:40, the resulting nanolaminate thin film has a desirably low dielectric constant of about 4.6 (FIG. 2B) and the etching rate is less than 2 Å/min for the $H_2SO_2$ boiling (FIG. 2A).

Figure 3:
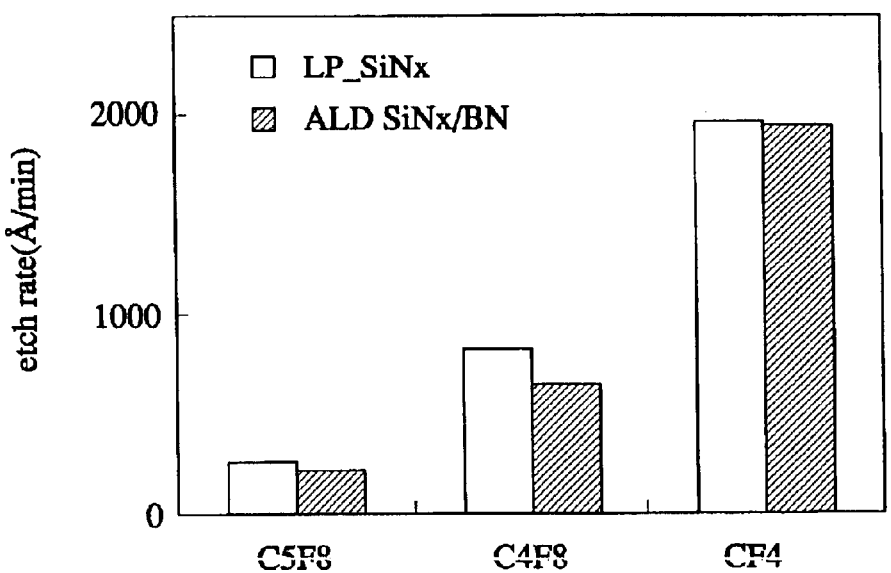
FIG. 3 shows a graph representing the etching rates of several nanolaminate thin films structures consisting of alternating SiNx/BN thin films according to the present invention compared with that of a SiNx thin film deposited by a LPCVD process.

FIG. 3 is a bar graph comparing the reactive ion etching (RIE) rates of several nanolaminate thin films consisting of alternating SiNx/BN thin films (ALD SiNx/BN), where the ratio of the cycle number m of the SiNx thin film to the cycle number n of the BN thin film, i.e. m:n is 30:40 according to the present invention, with comparable SiNx thin films (LP_SiNx) deposited by the LPCVD method. Referring to FIG. 3, it is seen that nanolaminate thin films consisting of alternating SiNx/BN thin films in accordance with the present invention demonstrate improved RIE etching rates of about 20% and 16%, respectively, under the etching conditions of $C_4F_8/Ar/O_2$ and $C_5F_8/CH_2F_2/Ar/CO/O_2$, respectively, in comparison with the LPCVD SiNx thin films. Under etching conditions of $CF_4$, the nanolaminate thin film of this invention shows a somewhat smaller etching rate improvement relative to the rate for an LP_SiNx film.

Figure 4:
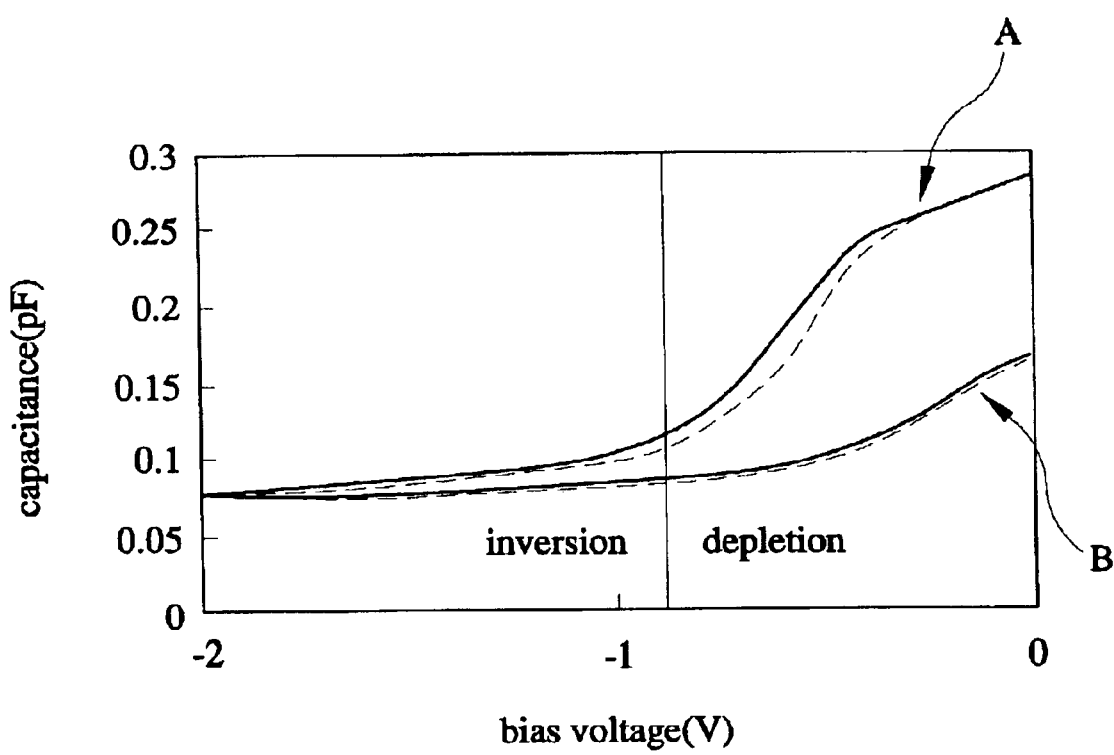
FIG. 4 shows a curve representing the correlation between bias voltage and capacitance of an ALD BN thin film compared with a nanolaminate thin film consisting of alternating SiNx/BN thin films according to this invention, both before and after an annealing process.

FIG. 4 shows curves representing correlations between bias voltage and capacitance for a single ALD BN thin film compared with a nanolaminate thin film consisting of alternating SiNx/BN thin films according to this invention before and after the annealing process. In FIG. 4, "A" is the capacitance-voltage (C-V) curve for the single ALD BN thin film, and "B" is the C-V curve for the nanolaminate thin film (single ALD SiNx/BN thin films formed by the ALD process). The C-V curves A and B as shown in the FIG. 4 are respectively measured on MOS capacitors which use the ALD BN thin film and the nanolaminate thin film of SiNx/BN thin films as a dielectric film, respectively. Dotted lines associated with curve A and curve B, respectively, indicate the C-V curves for these two films before the annealing step. Solid lines of curves A and B indicate the C-V curves after the annealing step has been carried out for 60 minutes at a temperature of 850° C.

Referring to FIG. 4, comparing the dotted and solid portions of curve A for the ALD BN thin film, it can be seen that the C-V curve has shifted significantly after the annealing step. The explanation for this shift is that excess boron has out-diffused from the ALD BN thin film during the annealing operation.

Figure 5:
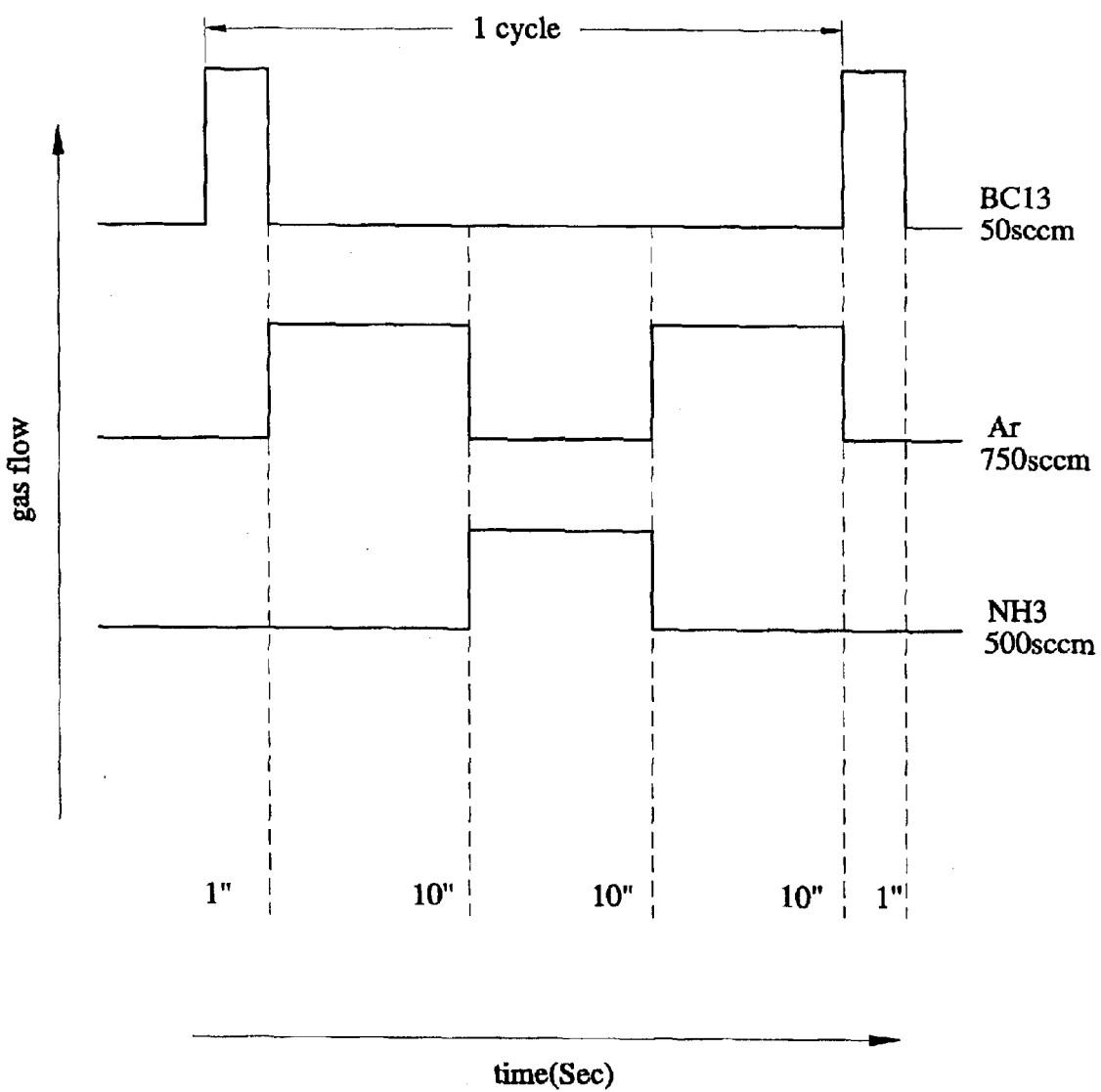
FIG. 5 shows a graph representing a sequence for supplying the various silicon nitride process gases used for depositing a SiNx thin film on the substrate in accordance with the process for forming an insulating layer of the multi-layer nanolaminate structure consisting of alternating SiNx/BN thin films according to the present invention.
Figure 6:
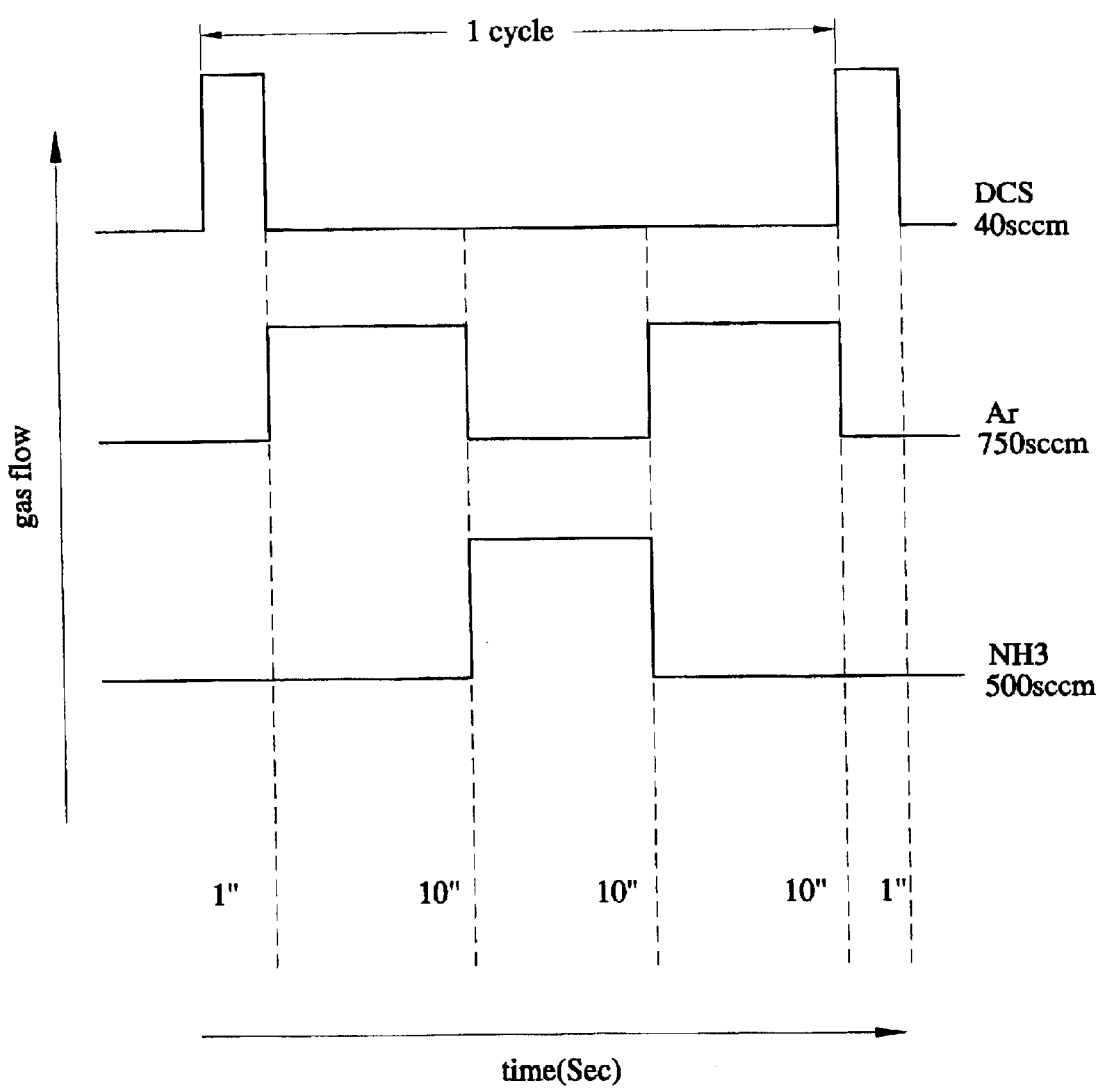
FIG. 6 shows a graph representing a sequence for supplying the various boron nitride process gases used for depositing a BN thin film on a SiNx thin film in accordance with the process for forming an insulating layer of the multi-layer nanolaminate structure consisting of alternating the SiNx/BN thin films according to the present invention.

By contrast, comparing the dotted and solid portions of curve B for the nanolaminate thin film consisting of SiNx/BN thin films of the present invention, there is virtually no shifting of the curve after annealing indicating that the outdiffusion of boron is suppressed. FIG. 5 and FIG. 6 show sequences of supplying the process gases for depositing respectively the SiNx thin films and the BN thin films using the RP-ALD method according to a preferred embodiment of the present invention. First, a preferred method for depositing SiNx thin film layers using the RP-ALD method will be described with reference to FIG. 5.

The pressure of a film deposition chamber is kept less than atmospheric pressure using a pump. A wafer having at least a surface where an SiNx thin film is to be deposited, such as a single crystalline silicon substrate, is loaded into the chamber, which is heated to a temperature from about 200° C. to 750° C., followed by a desired number of silicon nitride deposition cycles to deposit the SiNx thin film.

Each cycle for depositing a SiNx thin film layer includes four steps or processes as follows: (a) In a first process or step, the first silicon nitride process gas containing silicon Si, such as $SiH_2Cl_2$, $SiCl_4$, $Si_2Cl_6$, or $SiH_4$, is introduced to the chamber at a desired partial pressure and for a desired time, such that a surface of the wafer adsorbs a sufficient amount of the first silicon nitride process gas to be substantially saturated. (b) In a second process or step, a second silicon nitride process gas is introduced for purging the chamber, for example, an inert gas, such as argon (Ar) or helium (He), or nitrogen ($N_2$) gas. The second step is continued until substantially all of the first silicon nitride process gas has been exhausted from the chamber and there is no further reaction gas or reaction byproduct. The chamber may be maintained at a low partial pressure used for carrying out the first step.

(c) Next, in a third process or step, a third silicon nitride process gas containing a reactive nitrogen entity, for example, a reactive gas such as $NH_3$ or $N_2H_4$, is introduced to the chamber at a desired partial pressure and for a desired time, such that the first silicon nitride process gas previously adsorbed on the wafer surface reacts with the third silicon nitride process gas substantially to form a SiNx monolayer containing Si and N. In this third process or step, either $NH_3$ or $N_2H_4$ in the form of a gas or as a radical type, or, alternatively, a mixture of $N_2$ and $H_2$ as a mixture of a radical type may be used as the third silicon nitride process gas. (d) In a fourth process or step, a fourth to silicon nitride process gas is introduced for purging in the chamber, i.e., an inert gas such as argon (Ar) or helium (He), or nitrogen ($N_2$) gas. The fourth step is continued until substantially all of the third silicon nitride process gas has been exhausted from the chamber and there is no further reaction gas or reaction byproduct, such as HCl. The chamber may be maintained at a low partial pressure used for carrying out the third step.

In this embodiment, the purge gas is introduced into the chamber only for the second and fourth processes to exhaust the first and third silicon nitride process gases that remain unreacted or unadsorbed, together with gas reaction byproducts, after, respectively, the first and the third processes. In an alternative embodiment, the purge gas may be introduced throughout the entire four-step cycle. During the first and third steps, the first and third silicon nitride process gases respectively are added to the gas flow through the chamber, while during the second and fourth steps only the purge gas flows through the chamber to exhaust reactive gases and gas reaction by-products in these second and the fourth steps.

As described above, the method for depositing the SiNx monolayer includes four separate steps or processes. The SiNx thin film 210 is formed at the desired thickness by repeatedly using the four processes for depositing the monolayer. Each complete four-step operation constitutes one SiNx cycle as defined herein. In other words, a predetermined number of cycles for depositing the SiNx monolayer are repeated sequentially to obtain a SiNx thin film (210 in FIG. 1) of the desired thickness on the wafer surface. Precise control of the thickness of a particular SiNx thin film 210 can be achieved because the SiNx monolayer deposited per one cycle using the ALD method has a substantially constant thickness.

Next, a preferred method for depositing the boron nitride (BN) thin film layers will be described with reference to the FIG. 6.

One complete cycle for depositing a BN thin film layer includes four processes or steps as follows: (a) In a first process or step, the first boron nitride process gas containing boron B, such as $BCl_3$, $BBr_3$, $B_2H_6$, or $BF_3$, is introduced to the chamber at a desired partial pressure and for a desired time, such that the already deposited SiNx layer adsorbs on a surface of the SiNx thin film 210 formed on the surface of the wafer a sufficient amount of the first boron nitride process gas tobe substantially saturated. (b) In a second process or step, a second boron nitride process gas is introduced for purging the chamber, for example, an inert gas, such as argon (Ar) or helium (He), or nitrogen ($N_2$) gas. The second step is continued until substantially all of the first boron nitride process gas has been exhausted from the chamber and there is no further reaction gas or reaction byproduct. The chamber may be maintained at a low partial pressure used for the first step.

(c) Next, in carrying out a third process or step, a third boron nitride process gas containing a reactive nitrogen entity, for example, a reactive gas such as $NH_3$ or $N_2H_2$, is introduced to the chamber at a desired partial pressure and for a desired time, such that the first boron nitride process gas previously adsorbed on the surface of the SiNx thin film reacts with the third boron nitride process gas to form a BN monolayer containing B and N. In this third step, $N_2$, $H_2$, $NH_3$ and a mixed gas comprising these gases may be used with the radical type as the third boron nitride process gas. (d) Finally, in a fourth process or step, a fourth boron nitride process gas is introduced for purging the chamber, i.e., an inert gas such as argon (Ar) or helium (He), or nitrogen ($N_2$) gas. The fourth step is continued until substantially all of the third boron nitride process gas has been exhausted from the chamber and there is no further reaction gas or reaction byproduct such as HCl. The chamber may be maintained at a low partial pressure used for carrying out the thirdstep.

In this embodiment, the purge gas is introduced into the chamber only for the second and fourth processes to exhaust the first and third boron nitride process gases that remain unreacted or unadsorbed, together with gas reaction byproducts, after, respectively, the first and the third processes. In an alternative embodiment, the purge gas may be introduced throughout the entire four-step cycle. During the first and third steps, the first and third boron nitride process gases respectively are added to the gas flow through the chamber, while during the second and fourth steps only the purge gas flows through the chamber to exhaust reactive gases and gas reaction by-products in these second and the fourth steps.

As described above, the method for depositing the BN monolayer includes four separate steps or processes. The BN thin film 220 is formed on the SiNx thin film 210 at the desired thickness by repeatedly using the four processes for depositing each monolayer. Each complete four-step depositing operation constitutes one BN cycle as herein defined. In other words, a predetermined number of cycles for depositing the BN monolayer are repeated sequentially to obtain a BN thin film (220 in FIG. 1) of the desired thickness on the previously-deposited SiNx thin film layer. Precise control of the thickness of a particular BN thin film 220 can be achieved because the BN monolayer deposited per one cycle using the ALD method has a substantially constant thickness.

Accordingly, the process for depositing each SiNx thin film 210 comprise multiple four-step SiNx deposition cycles, and the process for depositing each BN thin film 220 comprises multiple four-step BN deposition cycles, which deposition processes are alternately repeated, thereby forming the multi-layer nanolaminate thin film 200 consisting of alternating SiNx/BN thin films, each of a desired thickness, on the wafer 100 as seen in FIG. 1.

In accordance with the muti-layer nanolaminate thin film 200 consisting of the alternating SiNx/BN thin films, the cycle number m of each SiNx thin film is preferably about 25–35 times, such as 30 times, and the cycle number n of each BN thin film is preferably about 35–45 times, such as 40 times. In other words, the cycle shown in the FIG. 5 is preferably repeated 30 times to form each SiNx thin film 210 of the desired thickness in FIG. 1, and the cycle shown in the FIG. 6 is preferably repeated 40 times to form each BN thin film 220 of the desired thickness in FIG. 1. The thickness of each SiNx thin film 210 is therefore greater than that of an SiNx monolayer (formed by one deposition cycle), but still preferably less than 200 Å. The thickness of each BN thin film 220 is therefore also greater than that of a BN monolayer (formed by one deposition cycle), but still preferably less than 200 Å.

In accordance with preferred embodiments of the present invention, the processes for alternately depositing SiNx thin films 210 and BN thin films 220 to form the multi-layer nanolaminate thin film 200 consisting of alternating SiNx/BN thin films are performed in-situ in a suitable deposition chamber. The interior volume of the chamber may be about 7 liter, the temperature of the wafer may be maintained at approximately 400° C. to 600° C., and the deposition pressure may be about 1 to 3 torr.

Also, in accordance with the multi-layer nanolaminate thin film 200 consisting of alternating SiNx/BN thin films of the present invention, an SiNx thin film 210 is preferably formed as a bottom layer or as both a bottom layer and a top layer of the multi-layer nanolaminate thin film 200. As a result, the first SiNx thin film is formed on the wafer surface below the first BN thin film and can thereby act as a barrier layer, thereby constraining any out diffusion of boron from the BN thin film.

As described above, an insulating layer to be used as a dielectric thin film in a semiconductor device may be formed with a multi-layer nanolaminate thin film according to this invention wherein SiNx thin films and the BN thin films are alternately laminated, thereby improving the properties of wet etching as well as improving propagation delay properties by obtaining a low dielectric constant. Also, the present invention is capable of minimizing or preventing the out diffusion of boron from the BN thin films.

While the invention has been particularly shown and described with reference to preferred embodiments thereof, it will be understood by those skilled in the art that the foregoing and other changes in form and details may be made therein without departing from the spirit and scope of the invention.

Having described the invention, what is claimed is:

1. A semiconductor device having improved etching properties comprising a wafer having an insulating layer with bottom and top portions along at least a surface thereof, wherein said insulating layer is specially prepared with alternating thin film layers of silicon nitride and boron nitride, each being of a controlled thickness, so as to exhibit the properties of a relatively low dielectric constant and a relatively low etching rate during high temperature, wet chemical etch processing, said insulating layer consisting essentially of at least two silicon nitride thin film layers, each such silicon nitride thin film layer representing about 25–35 silicon nitride ALD deposition cycles, said silicon nitride thin film layers alternating with at least two boron nitride thin film layers, each such boron nitride thin film layer representing about 35–45 boron nitride ALD deposition cycles.

2. A semiconductor device according to claim 1, wherein the thickness of each silicon nitride thin film layer is more than that of a monolayer of silicon nitride, but less than about 200 Å.

3. A semiconductor device according to claim 1, wherein the thickness of each boron nitride thin film layer is more than that of a monolayer of boron nitride, but less than about 200 Å.

4. A semiconductor device according to claim 1, wherein the thin film layer adjacent to a surface of said wafer is a silicon nitride thin film.

5. A semiconductor device according to claim 1, wherein the thin film layers which form the bottom and the top portions of said insulating layer are silicon nitride thin films.

6. A semiconductor device according to claim 1, wherein said insulating layer comprises two of said silicon nitride thin film layers alternating with two of said boron nitride thin film layers.

7. A semiconductor device according to claim 1, wherein said insulating layer comprises more than two of said silicon nitride thin film layers alternating with at least two of said boron nitride thin film layers.

8. A semiconductor device according to claim 1, wherein each silicon nitride thin film layer comprises sequential depositions of 30 monolayers of silicon nitride.

9. A semiconductor device according to claim 1, wherein each boron nitride thin film layer comprises sequential depositions of 40 monolayers of boron nitride.

10. A semiconductor device according to claim 1, wherein each silicon nitride thin film layer is of substantially uniform thickness.

11. A semiconductor device according to claim 1, wherein each boron nitride thin film layer is of substantially uniform thickness.

12. A method for forming an insulating layer specially prepared with alternating thin film layers of silicon nitride and boron nitride, each being of a controlled thickness, so as to exhibit the properties of a relatively low dielectric constant and a relatively low etching rate during high temperature, wet chemical etch processing on at least a surface of a semiconductor device, said method comprising the steps of:

(a) forming a silicon nitride thin film representing about 25–35 silicon nitride ALD deposition cycles on a surface of a semiconductor wafer;

(b) forming a boron nitride thin film representing about 35–45 boron nitride ALD deposition cycles on the previously formed silicon nitride thin film; and, (c) forming a multi-layer nanolaminate thin film on the surface of the wafer by alternately repeating steps (a) and (b).

13. A method according to claim 12, wherein during the deposition cycles the temperature of the wafer is maintained at about 400° C. to about 600° C., and the deposition pressure is maintained at about 1 to 3 torr.

14. A method according to claim 12, wherein the silicon nitride thin films and the boron nitride thin films are sequentially deposited in-situ.

15. A method according to claim 12, wherein a depositing cycle for forming each silicon nitride thin film comprises the sequential steps of:

introducing a first silicon nitride process gas containing silicon Si to a chamber containing the wafer such that at least a portion of said first silicon nitride process gas is adsorbed on a surface of the wafer;

introducing a substantially inert second silicon nitride process gas to the chamber to purge the chamber and to exhaust unadsorbed first silicon nitride process gas;

introducing a third silicon nitride process gas containing a reactive nitrogen entity to the chamber to react with the first silicon nitride process gas adsorbed on the wafer surface; and, introducing a substantially inert fourth silicon nitride process gas to the chamber to purge the chamber and to exhaust unreacted third silicon nitride process gas and reaction by-products.

16. A method according to claim 15, wherein the first silicon nitride process gas is selected from the group consisting of $SiH_2Cl_2$, $SiCl_4$, $Si_2Cl_6$, and $SiH_4$.

17. A method according to claim 15, wherein the second silicon nitride process gas and the fourth silicon nitride process gas are each selected from the group consisting of argon, helium and nitrogen gas.

18. A method according to claim 15, wherein the third silicon nitride process gas is selected from one of either $NH_3$ or $N_2H_4$ in the form of a gas or as a radical type, or, alternatively, a mixture of $N_2$ and $H_2$ as a mixture of a radical type.

19. A method according to claim 12, wherein a depositing cycle for forming each boron nitride thin film comprises the sequential steps of:

introducing a first boron nitride process gas containing boron B to a chamber containing the wafer such that at least a portion of said first boron nitride process gas is adsorbed on a surface of a previously-deposited silicon nitride thin film;

introducing a substantially inert second boron nitride process gas to the chamber to purge the chamber and to exhaust unadsorbed first boron nitride process gas;

introducing a third boron nitride process gas containing a reactive nitrogen entity to the chamber to react with the first boron nitride process gas adsorbed on the silicon nitride thin film; and, introducing a substantially inert fourth boron nitride process gas to the chamber to purge the chamber and to exhaust unreacted third boron nitride process gas and reaction by-products.

20. A method according to claim 19, wherein the first boron nitride process gas is selected from the group consisting of $BCl_3$, $BBr_3$, $B_2H_6$, and $BF_3$.

21. A method according to claim 19, wherein the second boron nitride process gas and the fourth boron nitride process gas are each selected from the group consisting of argon, helium and nitrogen gas.

22. A method according to claim 19, wherein the third boron nitride process gas is selected from one of either $NH_3$ or $N_2H_4$ in the form of a gas or as a radical type, or, alternatively, a mixture of $N_2$ and $H_2$ as a mixture of a radical type.

23. A semiconductor device having improved etching properties comprising a wafer having an insulating layer specially prepared to exhibit the properties of a relatively low dielectric constant below about 5 and a relatively low etching rate below about 10 Å/min, during high temperature, wet chemical etch processing formed along at least a surface thereof, said insulating layer being formed by the process of:

(a) forming a silicon nitride thin film representing about 25–35 silicon nitride ALD deposition cycles on a surface of a semiconductor wafer;

(b) forming a boron nitride thin film representing about 35–45 boron nitride ALD deposition cycles on the previously formed silicon nitride thin film; and, (c) forming a multi-layer nanolaminate thin film on the surface of the wafer by alternately repeating steps (a) and (b).

24. A semiconductor device according to claim 23 wherein during the deposition cycles the temperature of the wafer is maintained at about 400° C. to about 600° C., and the deposition pressure is maintained at about 1 to 3 torr.

25. A semiconductor device according to claim 23 wherein the silicon nitride thin films and the boron nitride thin films are sequentially deposited in-situ.

26. A semiconductor device according to claim 23 wherein a depositing cycle for forming each silicon nitride thin film comprises the sequential steps of:

introducing a first silicon nitride process gas containing silicon Si to a chamber containing the wafer such that at least a portion of said first silicon nitride process gas is adsorbed on a surface of the wafer;

introducing a substantially inert second silicon nitride process gas to the chamber to purge the chamber and to exhaust unadsorbed first silicon nitride process gas;

introducing a third silicon nitride process gas containing a reactive nitrogen entity to the chamber to react with the first silicon nitride process gas adsorbed on the wafer surface; and, introducing a substantially inert fourth silicon nitride process gas to the chamber to purge the chamber and to exhaust unreacted third silicon nitride process gas and reaction by-products;

and, wherein a depositing cycle for forming each boron nitride thin film comprises the sequential steps of:

introducing a first boron nitride process gas containing boron B to a chamber containing the wafer such that at least a portion of said first boron nitride process gas is adsorbed on a surface of a previously-deposited silicon nitride thin film;

introducing a substantially inert second boron nitride process gas to the chamber to purge the chamber and to exhaust unadsorbed first boron nitride process gas;

introducing a third boron nitride process gas containing a reactive nitrogen entity to the chamber to react with the first boron nitride process gas adsorbed on the silicon nitride thin film; and, introducing a substantially inert fourth boron nitride process gas to the chamber to purge the chamber and to exhaust unreacted third boron nitride process gas and reaction by-products.

27. A semiconductor device according to claim 23 wherein each silicon nitride thin film layer is of substantially uniform thickness and wherein each boron nitride thin film layer is of substantially uniform thickness.

28. A semiconductor device according to claim 23 wherein the number of depositing cycles used for forming each silicon nitride thin film is 30 times, and the number of depositing cycles used for forming each boron nitride thin film is 40 times.

29. A semiconductor device according to claim 26, wherein the first silicon nitride process gas is selected from the group consisting of $SiH_2Cl_2$, $SiCl_4$, $Si_2Cl_6$, and $SiH_4$.

30. A semiconductor device according to claim 26, wherein the second silicon nitride process gas and the fourth silicon nitride process gas are each selected from the group consisiting of argon, helium and nitrogen gas.

31. A semiconductor device according to claim 26, wherein the third silicon nitride process gas is selected from one of either $NH_3$ or $N_2H_4$ in the form of a gas or as a radical type, or, alternatively, a mixture of $N_2$ and $H_2$ as a mixture of a radical type.

32. A semiconductor device according to claim 26, wherein the first boron nitride process gas is selected from the group consisting of $BCl_3$, $BBr_3$, $B_2H_6$, and $BF_3$.

33. A semiconductor device according to claim 26, wherein the second boron nitride process gas and the fourth boron nitride process gas are each selected from the group consisting of argon, helium and nitrogen gas.

34. A semiconductor device according to claim 26, wherein the third boron nitride process gas is selected from one of either $NH_3$ or $N_2H_4$ in the form of a gas or as a radical type, or, alternatively, a mixture of $N_2$ and $H_2$ as a mixture of a radical type.

* * * * *